US012653052B2

(12) United States Patent
Chang et al.

(10) Patent No.: US 12,653,052 B2
(45) Date of Patent: Jun. 9, 2026

(54) ELECTRONIC PACKAGE, PACKAGE SUBSTRATE AND MANUFACTURING METHOD THEREOF

(71) Applicant: AaltoSemi Inc., Nanjing City (CN)

(72) Inventors: Andrew C. Chang, Nanjing City (CN); Min-Yao Chen, Nanjing City (CN); Yin-Ju Chen, Nanjing City (CN)

(73) Assignee: AaltoSemi Inc., Nanjing City (CN)

( * ) Notice: Subject to any disclaimer, the term of this patent is extended or adjusted under 35 U.S.C. 154(b) by 214 days.

(21) Appl. No.: 18/414,740

(22) Filed: Jan. 17, 2024

(65) Prior Publication Data

US 2024/0243048 A1 Jul. 18, 2024

(30) Foreign Application Priority Data

Jan. 17, 2023 (TW) ................................. 112102059

(51) Int. Cl.
| | |
|---|---|
| *H10W 70/685* | (2026.01) |
| *H10W 70/05* | (2026.01) |
| *H10W 70/63* | (2026.01) |
| *H10W 70/69* | (2026.01) |
| *H10W 72/00* | (2026.01) |
| *H10W 72/20* | (2026.01) |
| *H10W 90/00* | (2026.01) |

(52) U.S. Cl.
CPC ......... *H10W 70/685* (2026.01); *H10W 70/05* (2026.01); *H10W 70/635* (2026.01); *H10W 70/69* (2026.01); *H10W 72/07254* (2026.01); *H10W 72/247* (2026.01); *H10W 90/722* (2026.01); *H10W 90/724* (2026.01)

(58) Field of Classification Search
CPC ........ H01L 23/49822; H01L 23/49894; H05K 1/0271; H05K 1/0298; H10W 70/685; H10W 70/635; H10W 70/05; H10W 70/07254; H10W 70/69; H10W 70/724; H10W 70/247; H10W 70/722; H10W 70/67; H10W 70/687
See application file for complete search history.

(56) References Cited

U.S. PATENT DOCUMENTS

| | | | | |
|---|---|---|---|---|
| 7,579,251 | B2 * | 8/2009 | Imanaka | ........... H01L 23/49822 |
| | | | | 438/329 |
| 10,043,740 | B2 * | 8/2018 | Boyapati | ............. H01L 21/4857 |
| 10,181,438 | B2 * | 1/2019 | Lee | ................... H01L 23/49838 |
| 10,304,766 | B2 * | 5/2019 | Kim | ................... H01L 25/0655 |
| 10,453,790 | B2 * | 10/2019 | Park | ................. H01L 23/49894 |
| 10,511,080 | B2 * | 12/2019 | So | ........................... H01Q 1/38 |
| 10,600,748 | B2 * | 3/2020 | Lee | .................. H01L 23/49894 |
| 11,183,447 | B2 * | 11/2021 | Chou | ................... H01L 21/486 |
| 2008/0237884 | A1 | 10/2008 | Hsu | |
| 2016/0353572 | A1 * | 12/2016 | Lim | ................. H01L 23/49894 |
| 2022/0013463 | A1 * | 1/2022 | Wu | .................. H01L 23/49894 |

FOREIGN PATENT DOCUMENTS

CN 106409802 A 2/2017

* cited by examiner

*Primary Examiner* — David A Zarneke
(74) *Attorney, Agent, or Firm* — Jose Cherson Weissbrot

(57) ABSTRACT

An electronic package is provided, in which one of insulating layers inside a package substrate is made of an Ajinomoto build-up film (ABF) material to facilitate the production of circuit structures using a redistribution layer (RDL) process, so that a circuit layer can meet the needs of high-density fine lines/fine spacing.

4 Claims, 5 Drawing Sheets

ELECTRONIC PACKAGE, PACKAGE SUBSTRATE AND MANUFACTURING METHOD THEREOF

CROSS-REFERENCE TO RELATED APPLICATIONS

The present application is based upon and claims the right of priority to Taiwan Patent Application No. 112102059, having a filing date of Jan. 17, 2023, the disclosure of which is hereby incorporated by reference herein in its entirety for all purposes.

BACKGROUND

1. Technical Field

The present disclosure relates to a semiconductor packaging process, and more particularly, to an electronic package with ABF and a package substrate and a manufacturing method thereof.

2. Description of Related Art

As the functional requirements of end products increase, semiconductor chips need to have more input/output (I/O) contacts. Therefore, the number of external contact pads of the package substrate used to carry the semiconductor chip also increases accordingly.

There are many technologies currently used in the field of chip packaging, for example, flip-chip package modules such as chip scale package (CSP), direct chip attached (DCA), or multi-chip module (MCM), or the three-dimensional stacking of chips can be integrated into three-dimensional integrated circuit (3D IC) chip stacking technology.

FIG. 1 is a schematic cross-sectional view of a conventional semiconductor package 1. As shown in FIG. 1, the manufacturing method of the semiconductor package 1 is to first provide a through-silicon interposer (TSI) 10, wherein the through-silicon interposer 10 has a die side 10a and a transfer side 10b opposing the die side 10a and a plurality of conductive through-silicon vias (TSVs) 100 connecting the die side 10a and the transfer side 10b, and the die side 10a has a redistribution layer (RDL) 12 electrically connected to the conductive through-silicon vias 100; next, a semiconductor chip 11 is electrically bonded to the redistribution layer 12 with electrode pads 110 thereon via a plurality of solder bumps 111, and an underfill 112 is filled between the semiconductor chip 11 and the through-silicon interposer 10 to cover the solder bumps 111; then, a package substrate 16 is electrically bonded to the conductive through-silicon vias 100 with bonding pads 160 thereon via a plurality of C4 specification conductive elements 15 such as solder bumps or copper pillars, and another underfill 17 is filled between the through-silicon interposer 10 and the package substrate 16 to cover the conductive elements 15; finally, a plurality of solder balls 19 are connected to the bottom side of the package substrate 16 for connecting a circuit board (not shown).

However, in the conventional semiconductor package 1, the through-silicon interposer 10 is used as the medium for signal transmission between the semiconductor chip 11 and the circuit board. Therefore, when manufacturing the through-silicon interposer 10, it is necessary to manufacture the conventional conductive through-silicon vias 100 and the C4 specification conductive elements 15, which greatly increases the process difficulty and manufacturing cost.

Moreover, the package substrate 16 needs to conduct electrical signals and dissipate heat via the conductive elements 15, resulting in poor conductive performance and heat dissipation performance of the package substrate 16.

Furthermore, the through-silicon interposer 10 needs to be disposed on the package substrate 16 via the conductive elements 15, so that it is difficult to reduce the overall thickness of the semiconductor package 1, thereby making it difficult for electronic products using the semiconductor package 1 to meet the demand for miniaturization.

In addition, during the manufacturing process of the conventional semiconductor package 1, the coefficient of thermal expansion (CTE) between the package substrate 16 and the through-silicon interposer 10 does not match (mismatch), so uneven thermal stress is likely to occur. As a result, when the solder bumps 111, the conductive elements 15 and the solder balls 19 are subsequently reflowed, the package substrate 16 will have great warpage, resulting in poor ball placement (that is, the solder balls 19 fall) and non-wetting of the solder balls 19 or cracking of the package substrate 16, thereby leading to reliability problems in terminal electronic products (such as computers, mobile phones, etc.) using the semiconductor package 1.

In addition, the combination of silicon materials and metal materials is not good, which is not conducive to the production of the redistribution layer 12, so the risk of separation of the redistribution layer 12 and the through-silicon interposer 10 is easy to occur.

Therefore, how to overcome the various problems of the above-mentioned conventional manufacturing methods has become an urgent issue to be solved.

SUMMARY

In view of the various deficiencies of the prior art, the present disclosure provides a package substrate, which comprises: a wiring structure having a first side and a second side opposing the first side, wherein the wiring structure includes at least one insulating layer and a wiring layer formed on the insulating layer, and a material for forming the insulating layer is an Ajinomoto build-up film; a first circuit structure disposed on the first side of the wiring structure, wherein the first circuit structure includes at least one first dielectric layer formed on the insulating layer and a first circuit layer formed on the first dielectric layer and electrically connected to the wiring layer, and a material for forming the first dielectric layer is different from the material for forming the insulating layer; and a second circuit structure disposed on the second side of the wiring structure, wherein the second circuit structure includes at least one second dielectric layer formed on the insulating layer and a second circuit layer formed on the second dielectric layer and electrically connected to the wiring layer, and a material for forming the second dielectric layer is different from the material for forming the insulating layer.

In the aforementioned package structure, the first circuit structure is bonded to a core board body having a first surface and a second surface opposing the first surface, and the first circuit structure is bonded onto the first surface of the core board body, wherein the core board body has a plurality of conductive vias connecting the first surface and the second surface, and the conductive vias are electrically connected to the first circuit layer.

The present disclosure also provides an electronic package, which comprises: the aforementioned package substrate; and at least one electronic element disposed on the second circuit structure and electrically connected to the second circuit layer.

The present disclosure further provides a method of manufacturing a package substrate, the method comprises: forming a wiring structure on a carrier, wherein the wiring structure has a first side and a second side opposing the first side, and the wiring structure is bonded to the carrier via the second side, wherein the wiring structure includes at least one insulating layer and a wiring layer formed on the insulating layer, and a material for forming the insulating layer is an Ajinomoto build-up film; forming a first circuit structure on the first side of the wiring structure, wherein the first circuit structure includes at least one first dielectric layer formed on the insulating layer and a first circuit layer formed on the first dielectric layer and electrically connected to the wiring layer, and a material for forming the first dielectric layer is different from the material for forming the insulating layer; removing the carrier to expose the second side of the wiring structure; and forming a second circuit structure on the second side of the wiring structure, wherein the second circuit structure includes at least one second dielectric layer formed on the insulating layer and a second circuit layer formed on the second dielectric layer and electrically connected to the wiring layer, and a material for forming the second dielectric layer is different from the material for forming the insulating layer.

The present disclosure further provides a method of manufacturing a package substrate, the method comprises: providing a core board body having a first surface and a second surface opposing the first surface, wherein the core board body has a plurality of conductive vias connecting the first surface and the second surface; forming a first circuit structure on the first surface of the core board body, wherein the first circuit structure includes at least one first dielectric layer formed on the core board body and a first circuit layer formed on the first dielectric layer and electrically connected to the conductive vias; forming a wiring structure on the first circuit structure, wherein the wiring structure has a first side and a second side opposing the first side, and the wiring structure is bonded to the first circuit structure via the first side, wherein the wiring structure includes at least one insulating layer formed on the first dielectric layer and a wiring layer formed on the insulating layer, and a material for forming the insulating layer is an Ajinomoto build-up film that is different from a material for forming the first dielectric layer; and forming a second circuit structure on the second side of the wiring structure, wherein the second circuit structure includes at least one second dielectric layer formed on the insulating layer and a second circuit layer formed on the second dielectric layer and electrically connected to the wiring layer, and a material for forming the second dielectric layer is different from the material for forming the insulating layer.

In the aforementioned package substrate and two methods, the first dielectric layer and the second dielectric layer are made of different materials.

The present disclosure further provides a method of manufacturing an electronic package, the method comprises: providing the aforementioned package substrate; and disposing at least one electronic element on the second circuit structure, wherein the at least one electronic element is electrically connected to the second circuit layer.

In the aforementioned electronic package and method, the present disclosure further comprises forming external elements on the first circuit structure, wherein the external elements are electrically connected to the first circuit layer.

As can be seen from the above, in the electronic package and the package substrate and the manufacturing method thereof according to the present disclosure, the conventional silicon board body is replaced with the insulating layer made of ABF, and the wiring layer is used as the medium for signal transmission between the electronic elements and the circuit board. Therefore, the process of making conventional through-silicon interposer related to conductive through-silicon vias and C4 specification conductive elements is not required, thus greatly reducing the manufacturing difficulty and production cost and greatly improving the electrical conductivity and heat dissipation performance of the package substrate.

Further, in the present disclosure, the wiring structure is directly connected to the first circuit structure so as to replace the cooperation of the conventional through-silicon interposer and C4 specification conductive elements, so that the thickness of the package substrate is conducive to thinning requirements.

Furthermore, the material for forming the insulating layer is different from the materials for forming the first and second dielectric layers, so as to facilitate the dispersion of thermal stress. Therefore, the package substrate of the present disclosure can effectively avoid the problem of warpage in subsequent processes.

In addition, the design of ABF as the insulating layer facilitates the use of the RDL process to manufacture the second circuit structure, so that the second circuit layer is conducive to meeting the requirements of high-density fine lines/fine spacing, and can reduce the risk of separation (peeling) of the second circuit structure and the wiring structure.

DETAILED DESCRIPTIONS

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "on," "upper," "first," "second," "one," "a" and the like are merely used for clear explanation rather than limiting the practicable scope of the present disclosure, and thus, alterations or adjustments of the relative relationships thereof without essentially altering the technical contents should still be considered in the practicable scope of the present disclosure.

FIG. 2A to FIG. 2E are schematic cross-sectional views illustrating a manufacturing method of an electronic package 2 according to a first embodiment of the present disclosure.

Figure 1:
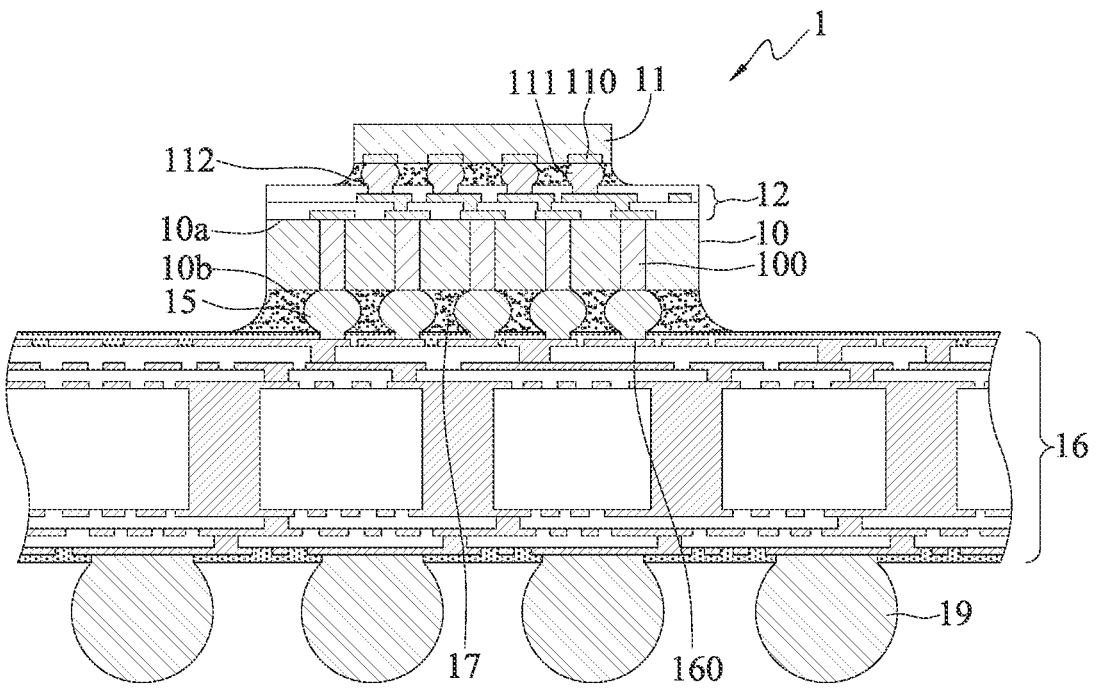
FIG. 1 is a cross-sectional view of a conventional semiconductor package.
Figure 2A:
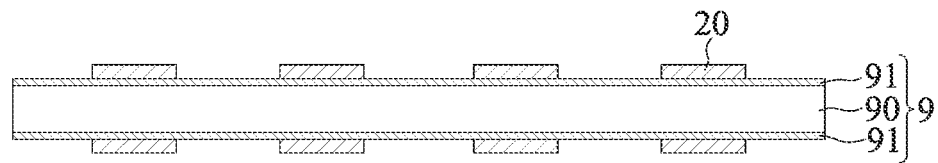
FIG. 2A to FIG. 2E are schematic cross-sectional views illustrating a manufacturing method of an electronic package according to a first embodiment of the present disclosure.

As shown in FIG. 2A, a wiring layer 20 is formed on a carrier 9.

In one embodiment, the carrier 9 is a temporary carrier board, such as a copper foil substrate or other board material. For example, the carrier 9 is a copper foil substrate, and its board body 90 has metal layers 91 on opposite sides.

Furthermore, the wiring layer 20 is made into patterned circuits via the metal layer 91 by electroplating metal (such as copper) or other methods.

Figure 2B:
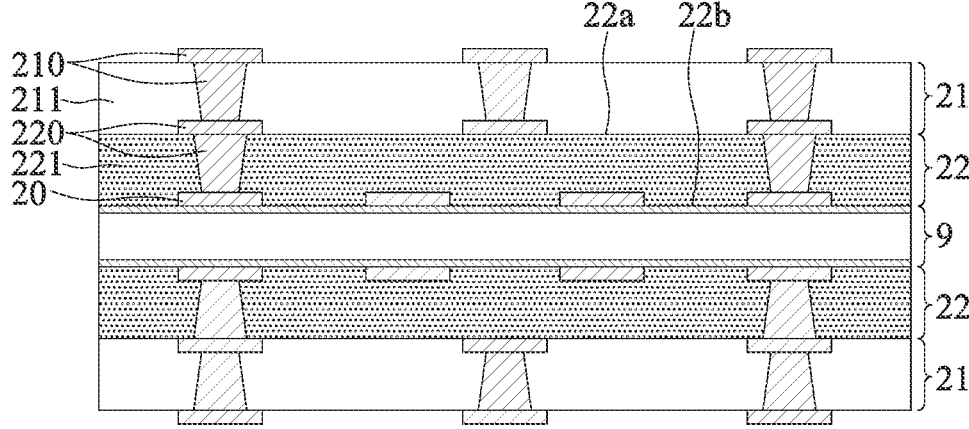

As shown in FIG. 2B, wiring structures 22 are formed on opposite sides of the carrier 9 in a symmetrical manner, and a first circuit structure 21 is formed on each of the wiring structures 22.

In one embodiment, each of the wiring structures 22 is defined with a first side 22a and a second side 22b opposing the first side 22a, wherein the second side 22b of the wiring structure 22 is bonded to the carrier 9, and the first circuit structure 21 is formed on the first side 22a of the wiring structure 22.

Furthermore, the wiring structure 22 includes at least one insulating layer 221 covering the wiring layer 20, and another wiring layer 220 formed on the insulating layer 221, so that the another wiring layer 220 is electrically connected to the wiring layer 20 on the metal layer 91, that is, the another wiring layer 220 uses the conductor electroplated in the laser blind hole formed on the insulating layer 221 to electrically conduct the wiring layer 20 on the metal layer 91. For example, the material for forming the insulating layer 221 is Ajinomoto build-up film (ABF), whose coefficient of thermal expansion (CTE) is 13 ppm/° C. to 17 ppm/° C., and the wiring layer 220 is made into patterned circuits by electroplating metal (such as copper) or other methods. It should be understood that by using a build-up process, the wiring structures 22 can add multiple layers of insulating layers 221 as needed to produce multiple layers of wiring layers 220.

In addition, the first circuit structure 21 includes at least a first dielectric layer 211 formed on the insulating layer 221, and a first circuit layer 210 formed on the first dielectric layer 211, so that the first circuit layer 210 is electrically connected to the wiring layer 220, that is, the first circuit layer 210 uses the conductor electroplated in laser blind hole formed on the first dielectric layer 211 to electrically conduct the wiring layer 220. For example, the first circuit structure 21 is made using a build-up process, so that the first circuit structure 21 can add multiple layers of first dielectric layers 211 as needed to produce multiple layers of first circuit layers 210, and the first dielectric layer 211 is made of a material such as polybenzoxazole (PBO), polyimide (PI), fiberglass prepreg (PP), or other dielectric materials. Therefore, the material for forming the first dielectric layer 211 and the material for forming the insulating layer 221 may be different. For example, the material for forming the first dielectric layer 211 is prepreg (PP), and the coefficient of thermal expansion (CTE) of the first dielectric layer 211 is 10 ppm/° C.

In addition, the line width/line spacing of the first circuit layer 210 is approximately 50/50 microns (μm) at most, and the line width/line spacing of the wiring layer 220 is approximately 10/10 microns (μm) at most.

Figure 2C:
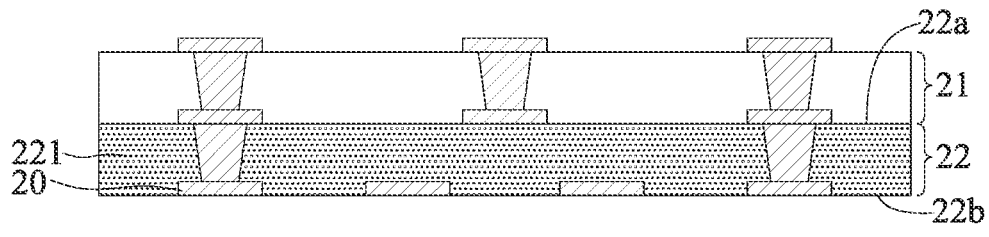

As shown in FIG. 2C, the carrier 9 is removed to expose the second side 22b of the wiring structure 22 and the wiring layer 20 therein.

In one embodiment, the board body 90 can be peeled off or ground first, and then the metal layer 91 can be removed by etching, so that the wiring layer 20 is flush with or slightly recessed from the surface of the second side 22b of the wiring structure 22.

Figure 2D:
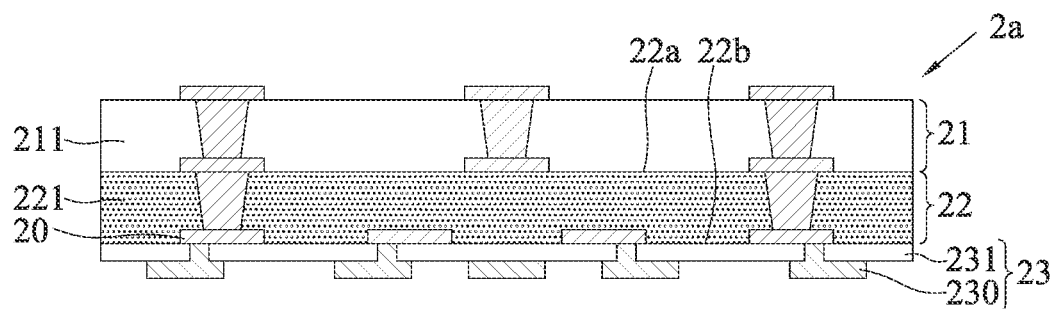

As shown in FIG. 2D, a second circuit structure 23 is formed on the second side 22b of the wiring structure 22 to form a package substrate 2a, and the wiring layer 20 is electrically connected to the second circuit structure 23.

In one embodiment, the second circuit structure 23 can be formed on the second side 22b of the wiring structure 22 by using a build-up process, so that the second circuit structure 23 can add multiple layers of second dielectric layers 231 as needed to produce multiple layers of second circuit layers 230. For example, the second circuit structure 23 includes at least the second dielectric layer 231 formed on the insulating layer 221 and the second circuit layer 230 formed on the second dielectric layer 231, so that the second circuit layer 230 is electrically connected to the wiring layer 20.

Furthermore, the second circuit layer 230 is of a redistribution layer (RDL) specification, and the line width/line spacing of the second circuit layer 230 is approximately 2/2 μm to 5/5 μm, wherein the second dielectric layer 231 is made of a material such as polybenzoxazole (PBO), polyimide (PI), fiberglass prepreg (PP), or other dielectric materials. For example, the material for forming the second dielectric layer 231 is polyimide (PI), and the CTE of the second dielectric layer 231 is 30 ppm/° C. to 35 ppm/° C., so that the material of the second dielectric layer 231 is different from the materials of the first dielectric layer 211 and the insulating layer 221.

Figure 2E:
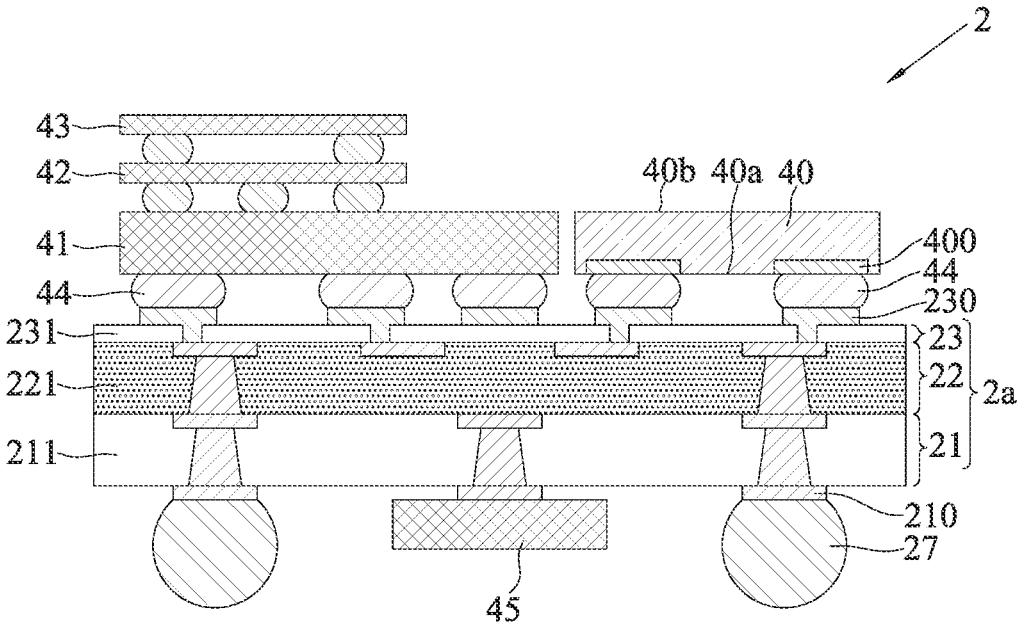

As shown in FIG. 2E, at least one electronic element 40, 41, 42, 43 is disposed on the second circuit structure 23, so that the electronic elements 40, 41, 42 and 43 are electrically connected to the second circuit layer 230. In addition, an encapsulating colloid (not shown) covering the electronic elements 40, 41, 42, 43 can also be formed.

In one embodiment, the electronic element 40 is an active element, a passive element, or a combination of the active element and the passive element, wherein the active element is, for example, a semiconductor chip, and the passive element is, for example, a resistor, a capacitor, or an inductor. For example, if the electronic element 40 is a semiconductor chip, it has an active surface 40a and an inactive surface 40b opposing the active surface 40a, wherein the active surface 40a has a plurality of electrode pads 400, and the electronic element 40 is electrically connected to the second circuit layer 230 via a plurality of conductive bumps 44 with the active surface 40a facing downward (such as a flip-chip method); alternatively, the electronic element 40 can also be electrically connected to the second circuit layer 230 in a wire bonding manner via a plurality of bonding wires (not shown); alternatively, the electronic element 40 may directly contact the second circuit layer 230. However, the manner in which the electronic element 40 is electrically connected to the second circuit layer 230 is not limited to the above.

Furthermore, the electronic elements 41, 42 and 43 can also be electronic elements of different types. For example, the electronic element 41 such as a control chip is disposed on the package substrate 2a via the plurality of conductive bumps 44, wherein at least one electronic element 42, 43 of a High Bandwidth Memory (HBM) type chip is stacked on the electronic element 41, and the electronic element 41 is electrically connected to the second circuit layer 230.

In addition, the opposite sides of the package substrate 2a have different uses. For example, the second circuit structure 23 is used as a die mounting side for connecting the semiconductor chip, and the first circuit structure 21 is used as a ball mounting side for connecting the circuit board. Therefore, the outermost first circuit layer 210 of the first circuit structure 21 can be bonded to a plurality of external elements 27 such as solder balls for externally connecting to an electronic device such as a circuit board (not shown).

In addition, the ball mounting side of the package substrate 2a can also be equipped with an electronic element, such as a passive element 45, as required.

Therefore, the manufacturing method of the present disclosure replaces the conventional silicon board body with the insulating layer 221 made of ABF, and uses the wiring layers 20, 220 as the medium for signal transmission between the electronic elements 40, 41, 42, 43 and the circuit board. Therefore, the process of making conventional through-silicon interposer related to conductive through-silicon vias and C4 specification conductive elements is not required, thus greatly reducing the manufacturing difficulty and production cost.

Further, the first circuit layer 210 and the wiring layer 220 are directly in contact with and connected to each other (that is, the conductor electroplated in the laser blind hole is used for electrical connection) so as to replace the conduction of the conventional C4 specification conductive element. Therefore, compared with conventional package substrates, the conductive performance and heat dissipation performance of the package substrate 2a are greatly improved.

Furthermore, the conventional through-silicon interposer can be replaced by embedding the wiring layer 20 in the insulating layer 221 and the coreless design of the first circuit structure 21 and the wiring structure 22, etc., so that the thickness of the package substrate 2a is conducive to thinning requirements.

In addition, the arrangement of the dielectric layers of the package substrate 2a gradually increases or decreases according to the magnitude of the CTE, so as to prevent the problem of warping from occurring to the package substrate 2a. For example, based on the direction of the package substrate 2a from the ball mounting side to the die mounting side (as shown in FIG. 2E, the direction from bottom to top), the CTE of the first dielectric layer 211 is the smallest, and the CTE of the second dielectric layer 231 is the largest. Therefore, during subsequent thermal processes such as reflowing the external elements 27 or reflowing the conductive bumps 44, the package substrate 2a can be effectively prevented from warping, so as to prevent the external elements 27 (or the conductive bumps 44) from peeling off, cracking, shifting, or other conditions that affect the yield.

In addition, the design of ABF as the insulating layer 221 and the wiring layer 20 being embedded in the insulating layer 221 facilitates the use of the RDL process to manufacture the second circuit layer 230, so that the second circuit layer 230 is conducive to meeting the requirements of high-density fine lines/fine spacing, and can reduce the risk of separation (peeling) of the second circuit layer 230 and the wiring structure 22.

FIG. 3A to FIG. 3D are schematic cross-sectional views illustrating a manufacturing method of an electronic package 3 according to a second embodiment of the present disclosure. The difference between the second embodiment and the first embodiment lies in the form of a package substrate 3a, so the similarities will not be described again below.

Figure 3A:
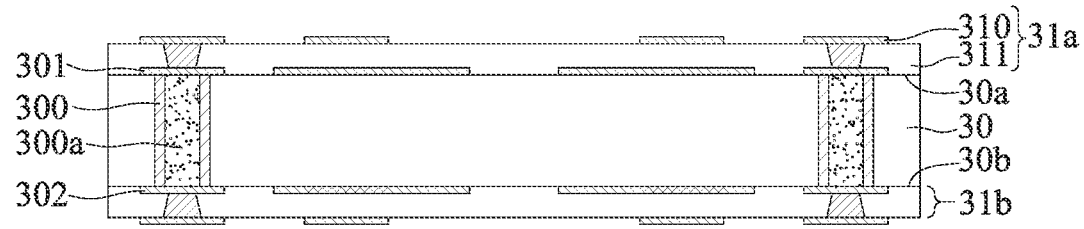
FIG. 3A to FIG. 3D are schematic cross-sectional views illustrating a manufacturing method of an electronic package according to a second embodiment of the present disclosure.

As shown in FIG. 3A, a core board body 30 is provided and has a first surface 30a and a second surface 30b opposing the first surface 30a, wherein an inner circuit layer 301 and an inner circuit layer 302 are formed on the first surface 30a and the second surface 30b of the core board body 30 respectively, and the core board body 30 has a plurality of conductive vias 300 connecting the first surface 30a and the second surface 30b, so that the conductive vias 300 are electrically connected to the inner circuit layers 301, 302.

In one embodiment, the core board body 30 may be made of a board material including bismaleimide triazine (BT), an organic polymer board material with fiberglass prepreg (PP), or other board materials, and the conductive via 300 is in the shape of a hollow pillar, and the hollow can be filled with a plugging material 300a, wherein the plugging material 300a can be of various types, such as conductive glue, ink, etc., and the present disclosure is not limited to as such. It should be understood that in other embodiments, the conductive via 300 can also be a solid metal cylinder without filling the plugging material 300a.

Furthermore, a first circuit structure 31a and a first circuit structure 31b are formed on the first surface 30a and the second surface 30b of the core board body 30 respectively, wherein the first circuit structures 31a and 31b include at least a first dielectric layer 311 formed on the core board body 30 and a first circuit layer 310 formed on the first dielectric layer 311, so that the first circuit layer 310 is electrically connected to the inner circuit layers 301, 302. For example, the first circuit structures 31a and 31b are made using a build-up process, and the first dielectric layer 311 is made of polybenzoxazole (PBO), polyimide (PI), fiberglass prepreg (PP), or other dielectric materials.

Figure 3B:
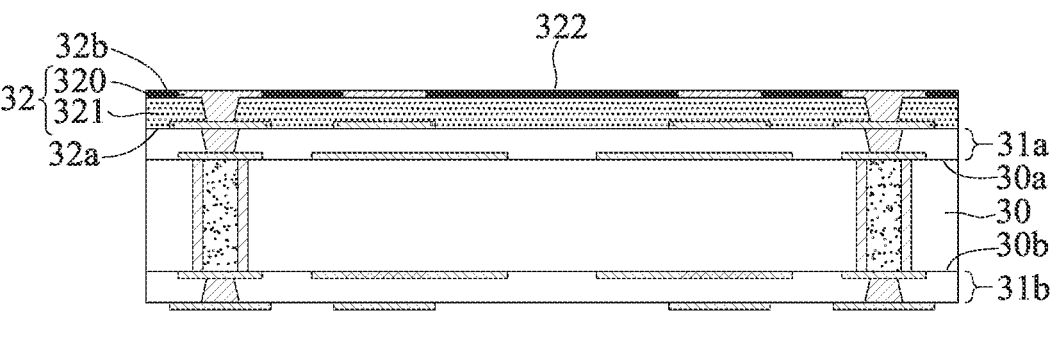

As shown in FIG. 3B, a patterning process is performed to form a wiring structure 32 on the first circuit structure 31a on one surface of the core board body 30 (e.g., the first surface 30a).

In one embodiment, each wiring structure 32 is defined with a first side 32a and a second side 32b opposing the first side 32a, and the wiring structure 32 is bonded to the first circuit structure 31a via the first side 32a.

Furthermore, the wiring structure 32 includes at least an insulating layer 321 and a wiring layer 320 formed on the insulating layer 321, so that the wiring layer 320 is electrically connected to the first circuit layer 310. For example, the material for forming the insulating layer 321 is Ajinomoto build-up film (ABF), and the wiring layer 320 is made into patterned circuits by electroplating metal (such as copper) or other methods. It should be understood that by using a build-up process, the wiring structures 32 can add multiple layers of the insulating layers 321 as needed to produce multiple layers of wiring layers 320.

In addition, another insulating layer 322 is formed on the outermost wiring layer 320 in the wiring structure 32, so that the wiring layer 320 is flush with the insulating layer 322, such that the wiring layer 320 is exposed from the insulating layer 322.

Figure 3C:
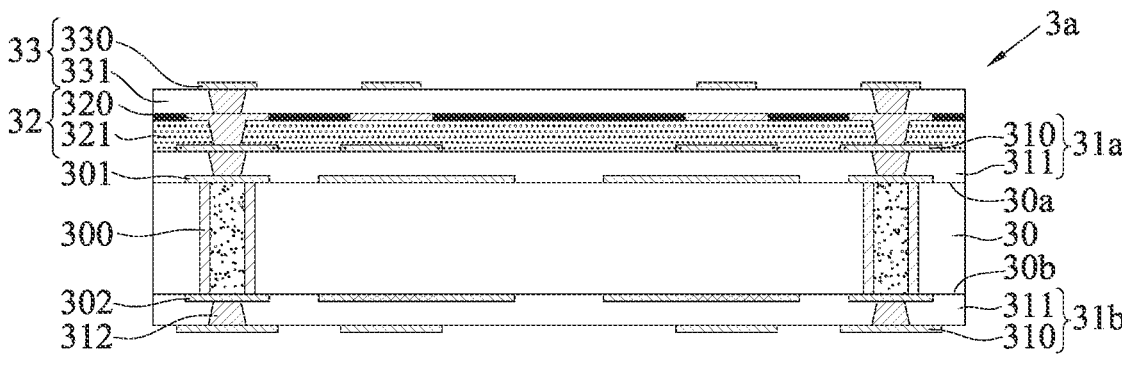

As shown in FIG. 3C, a second circuit structure 33 is formed on the second side 32b of the wiring structure 32 to form the asymmetric package substrate 3a, wherein the wiring layer 320 is electrically connected to the second circuit structure 33.

In one embodiment, the second circuit structure 33 can be formed on the second side 32b of the wiring structure 32 using a build-up process. For example, the second circuit structure 33 includes at least a second dielectric layer 331 formed on the insulating layer 321 and a second circuit layer 330 formed on the second dielectric layer 331, so that the second circuit layer 330 is electrically connected to the wiring layer 320.

Furthermore, the second circuit layer 330 is of a redistribution layer (RDL) specification, and the material for forming the second dielectric layer 331 is such as polybenzoxazole (PBO), polyimide (PI), fiberglass prepreg (PP), or other dielectric materials. For example, the material for forming the second dielectric layer 331 is polyimide (PI), so that the material of the second dielectric layer 331 is different from the materials of the first dielectric layer 311 and the insulating layer 321.

Figure 3D:
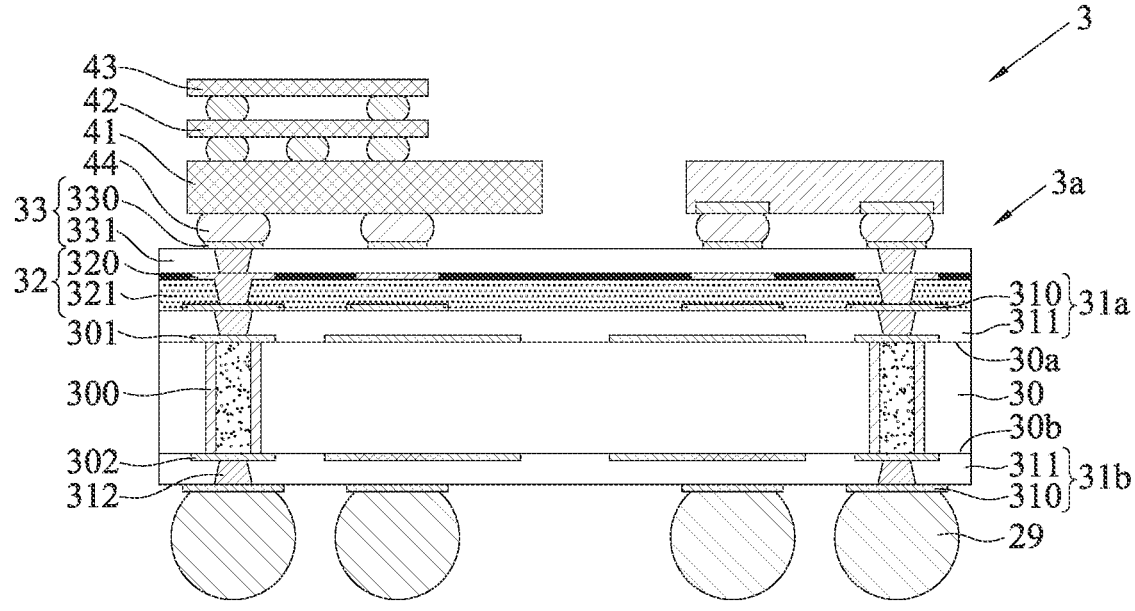

As shown in FIG. 3D, at least one electronic element 40, 41, 42, 43 is disposed on the second circuit structure 33, so that the electronic elements 40, 41, 42, 43 are electrically connected to the second circuit layer 330. In addition, an encapsulating colloid (not shown) covering the electronic elements 40, 41, 42, 43 can also be formed.

In one embodiment, the opposite sides of the package substrate 3a have different uses. For example, the second circuit structure 33 is used as a die mounting side for connecting the semiconductor chip, and the first circuit structure 31b is used as a ball mounting side for connecting the circuit board. Therefore, the outermost first circuit layer 310 of the first circuit structure 31b can be bonded to a plurality of external elements 29 such as solder balls for externally connecting to an electronic device such as a circuit board (not shown).

Therefore, the manufacturing method of the present disclosure replaces the conventional silicon board body with the insulating layer 321 made of ABF, and uses the wiring layer 320 as the medium for signal transmission between the electronic elements 40, 41, 42, 43 and the circuit board. Therefore, the process of making conventional through-silicon interposer related to conductive through-silicon vias and C4 specification conductive elements is not required, thus greatly reducing the manufacturing difficulty and production cost.

Further, the first circuit layer 310 and the wiring layer 320 are directly in contact with and connected to each other (that is, the conductor electroplated in the laser blind hole is used for electrical connection) so as to replace the conduction of the conventional C4 specification conductive element. Therefore, compared with conventional package substrates, the conductive performance and heat dissipation performance of the package substrate 3a are greatly improved.

Furthermore, the wiring structure 32 is directly bonded to the first circuit structure 31a, thereby eliminating the need for conventional C4 specification conductive elements, so that the thickness of the package substrate 3a is conducive to thinning requirements.

In addition, the arrangement of the dielectric layers of the package substrate 3a gradually increases or decreases according to the magnitude of the CTE, so as to prevent the problem of warping from occurring to the package substrate 3a.

In addition, the design of ABF as the insulating layer 321 facilitates the use of the RDL process to manufacture the second circuit layer 330, so that the second circuit layer 330 is conducive to meeting the requirements of high-density fine lines/fine spacing.

The present disclosure also provides a package substrate 2a, 3a, which comprises: a wiring structure 22, 32, a first circuit structure 21, 31a, and a second circuit structure 23, 33.

The wiring structure 22, 32 has a first side 22a, 32a and a second side 22b, 32b opposing the first side 22a, 32a, wherein the wiring structure 22, 32 includes at least one insulating layer 221, 321, 322 and the wiring layer 220, 320 formed on the insulating layer 221, 321, 322, and the material for forming the insulating layer 221, 321, 322 is Ajinomoto build-up film.

The first circuit structure 21, 31a is disposed on the first side 22a, 32a of the wiring structure 22, 32, wherein the first circuit structure 21, 31a includes at least one first dielectric layer 211, 311 formed on the insulating layer 221, 321 and a first circuit layer 210, 310 formed on the first dielectric layer 211, 311 and electrically connected to the wiring layer 220, 320, and a material for forming the first dielectric layer 211, 311 is different from a material for forming the insulating layer 221, 321, 322.

The second circuit structure 23, 33 is disposed on the second side 22b, 32b of the wiring structure 22, 32, wherein the second circuit structure 23, 33 includes at least one second dielectric layer 231, 331 formed on the insulating layer 221, 322 and a second circuit layer 230, 330 formed on the second dielectric layer 231, 331 and electrically connected to the wiring layer 220, 320, and a material for forming the second dielectric layer 231, 331 is different from the material for forming the insulating layer 221, 321, 322.

In one embodiment, the first dielectric layer 211, 311 and the second dielectric layer 231, 331 are made of different materials.

In one embodiment, the first circuit structure 31a is bonded to a core board body 30. The core board body 30 has a first surface 30a and a second surface 30b opposing the first surface 30a, so that the first circuit structure 31a is bonded onto the first surface 30a of the core board body 30, and the core board body 30 has a plurality of conductive vias 300 connecting the first surface 30a and the second surface 30b, so that the conductive vias 300 are electrically connected to the first circuit layer 310.

The present disclosure also provides an electronic package 2, 3, which comprises: the aforementioned package substrate 2a, 3a, and electronic elements 40, 41, 42, 43 disposed on the second circuit structure 23, 33 and electrically connected to the second circuit layer 230, 330.

In one embodiment, the electronic package 2, 3 further includes external elements 27, 29 formed on the first circuit structure 21, 31b and electrically connected to the first circuit layer 210, 310.

To sum up, in the electronic package and the package substrate and the manufacturing method thereof according to the present disclosure, the conventional silicon board body is replaced with the insulating layer made of ABF, and the wiring layer is used as the medium for signal transmission between the electronic elements and the circuit board. Therefore, the process of making conventional through-silicon interposer related to conductive through-silicon vias and C4 specification conductive elements is not required, thus greatly reducing the manufacturing difficulty and production cost and greatly improving the electrical conductivity and heat dissipation performance of the package substrate.

Further, the wiring structure is directly connected to the first circuit structure so as to replace the cooperation of the conventional through-silicon interposer and C4 specification conductive elements, so that the thickness of the package substrate is conducive to thinning requirements.

In addition, the arrangement of the dielectric layers of the package substrate gradually increases or decreases according to the magnitude of the CTE, so as to prevent the problem of warping from occurring to the package substrate in subsequent processes. In addition, the design of ABF as the insulating layer facilitates the use of the RDL process to manufacture the second circuit structure, so that the second circuit layer is conducive to meeting the requirements of high-density fine lines/fine spacing, and can reduce the risk of separation (peeling) of the second circuit structure and the wiring structure.

The foregoing embodiments are provided for the purpose of illustrating the principles and effects of the present disclosure, rather than limiting the present disclosure. Anyone skilled in the art can modify and alter the above embodiments without departing from the spirit and scope of the present disclosure. Therefore, the scope of protection with regard to the present disclosure should be as defined in the accompanying claims listed below.

What is claimed is:

1. A package substrate, comprising:

a wiring structure having a first side and a second side opposing the first side, wherein the wiring structure comprises a first wiring layer, a second wiring layer, and an insulating layer, wherein a material for forming the insulating layer is an Ajinomoto build-up film, wherein the first wiring layer protrudes from a surface of the first side, wherein the second wiring layer is flush with or recessed from a surface of the second side, wherein the insulating layer covers the second wiring layer, and wherein the first wiring layer is electrically connected to the second wiring layer through a laser blind hole formed in the insulating layer;

a first circuit structure disposed on the first side of the wiring structure, wherein the first circuit structure comprises a first dielectric layer formed on the insulating layer and a first circuit layer formed on the first dielectric layer, wherein a material for forming the first dielectric layer is prepreg, wherein the first circuit layer protrudes from a surface of the first dielectric layer remote from the wiring structure, and wherein the first circuit layer is electrically connected to the first wiring layer through a laser blind hole formed in the first dielectric layer; and a second circuit structure disposed on the second side of the wiring structure, wherein the second circuit structure comprises a second dielectric layer formed on the insulating layer and a second circuit layer formed on the second dielectric layer, wherein the second circuit layer is configured as a redistribution layer, wherein a material for forming the second dielectric layer is polyimide, wherein the second dielectric layer has a plurality of openings exposing portions of the surface of the second wiring layer, wherein the second circuit layer protrudes from a surface of the second dielectric layer remote from the wiring structure, and wherein the second circuit layer is electrically connected to the second wiring layer through the openings;

wherein the first circuit layer is bonded to a plurality of external elements comprising solder balls, wherein the second circuit layer is electrically connected to a semiconductor chip through a plurality of conductive bumps and electrode pads.

2. A method of manufacturing a package substrate, comprising:

forming a wiring structure on a carrier, wherein the wiring structure has a first side and a second side opposing the first side, and the wiring structure is bonded to the carrier via the second side, wherein the wiring structure, comprises a first wiring layer, a second wiring layer, and an insulating layer, wherein a material for forming the insulating layer is an Ajinomoto build-up film, wherein the first wiring layer protrudes from a surface of the first side, wherein the second wiring layer is flush with or recessed from a surface of the second side, wherein the insulating layer covers the second wiring layer, wherein the first wiring layer is electrically connected to the second wiring layer through a laser blind hole formed in the insulating layer;

forming a first circuit structure on the first side of the wiring structure, wherein the first circuit structure comprises a first dielectric layer formed on the insulating layer and a first circuit layer formed on the first dielectric layer, wherein a material for forming the first dielectric layer is prepreg, wherein the first circuit layer protrudes from a surface of the first dielectric layer remote from the wiring structure, and wherein the first cycle layer is electrically connected to the first wiring layer through a laser blind hole formed in the first dielectric layer;

removing the carrier to expose the second side of the wiring structure; and forming a second circuit structure on the second side of the wiring structure, wherein the second circuit structure comprises a second dielectric layer formed on the insulating layer and a second circuit layer formed on the second dielectric layer, wherein the second circuit layer is configured as a redistribution layer wherein a material for forming the second dielectric layer is polyimide;

wherein the first circuit layer is bonded to a plurality of external elements comprising solder balls, wherein the second circuit layer is electrically connected to a semiconductor chip through a plurality of conductive bumps and electrode pads.

3. A method of manufacturing a package substrate, comprising:

providing a core board body having a first surface and a second surface opposing the first surface, wherein the core board body comprises a first inner circuit layer, a second inner circuit layer, and a plurality of conductive vias, wherein the first inner circuit layer protrudes from a surface of the first surface, wherein the second inner circuit layer protrudes from a surface of the second surface, and wherein the conductive vias electrically connect the first inner circuit layer to the second inner circuit layer, thereby connecting the first surface and the second surface;

forming a first circuit structure on each of the first surface and the second surface of the core board body, wherein each of the first circuit structure comprises a first dielectric layer formed on the core board body and a first circuit layer formed on the first dielectric layer, and wherein a material for forming the first dielectric layer is prepreg, wherein the first circuit layer protrudes from a surface of the first dielectric layer remote from the core board body, and wherein each first circuit layer is electrically connected to a corresponding one of the first inner circuit layer or the second inner circuit layer;

forming a wiring structure on the first circuit structure disposed on the first surface, wherein the wiring structure has a first side and a second side opposing the first side, and the wiring structure is bonded to the first circuit structure via the first side, wherein the wiring structure comprises a first insulating layer formed on the first dielectric layer, a third wiring layer formed on the first insulating layer, and a second insulating layer disposed on the third wiring layer, wherein a material for forming the insulating layer is an Ajinomoto build-up film, wherein the third wiring layer is flush with the second insulating layer, and wherein the first insulating layer covers the first circuit layer, wherein the third wiring layer is electrically connected to the first circuit layer through a laser blind hole formed on the first insulating layer; and forming a second circuit structure on the second side of the wiring structure, wherein the second circuit structure comprises a second dielectric layer formed on the second insulating layer and a second circuit layer formed on the second dielectric layer, wherein the second circuit layer is configured as a redistribution layer, and wherein a material for forming the second dielectric layer is polyimide, wherein the second circuit layer protrudes from a surface of the second dielectric layer remote from the second side, and wherein the second circuit layer is electrically connected to the third wiring layer;

wherein the first circuit layer of the first circuit structure disposed on the second surface is bonded to a plurality of external elements comprising solder balls, wherein the second circuit layer is electrically connected to a semiconductor chip.

4. A package substrate, comprising:

a core board body having a first surface and a second surface opposing the first surface, wherein the core board body comprises a first inner circuit layer, a second inner circuit layer, and a plurality of conductive vias, wherein the first inner circuit layer protrudes from a surface of the first surface, wherein the second inner circuit layer protrudes from a surface of the second surface, wherein the conductive vias electrically connect the first inner circuit layer to the second inner circuit layer, thereby connecting the first surface and the second surface;

first circuit structures disposed on each of the first surface and the second surface of the core board body, wherein the first circuit structures comprise a first dielectric layer formed on the core board body and a first circuit layer formed on the first dielectric layer and wherein a material for forming the first dielectric layer is prepreg, wherein each first circuit layer protrudes from a surface of the first dielectric layer remote from the core board body, and is electrically connected to the first inner circuit layer or the second inner circuit layer;

a wiring structure having a first side and a second side opposing the first side, wherein the wiring structure is bonded to the first circuit structure disposed on the first surface via the first side, wherein the wiring structure comprises a first insulating layer formed on the first dielectric layer, a third wiring layer formed on the first insulating layer, and a second insulating layer disposed on the third wiring layer, wherein a material for forming the first insulating layer is an Ajinomoto build-up film, wherein the third wiring layer is flush with the second insulating layer, and the first insulating layer covers the first circuit layer, wherein the third wiring layer is electrically connected to the first circuit layer through a laser blind hole formed on the first insulating layer; and a second circuit structure disposed on the second side of the wiring structure, wherein the second circuit structure comprises a second dielectric layer formed on the second insulating layer and a second circuit layer formed on the second dielectric layer, wherein the second circuit layer is configured as a redistribution layer, wherein a material for forming the second dielectric layer is polyimide, wherein the second circuit layer protrudes from a surface of the second dielectric layer remote from the second side, and wherein the second circuit layer is electrically connected to the third wiring layer;

wherein the first circuit layer of the first circuit structure disposed on the second surface is bonded to a plurality of external elements comprising solder balls, wherein the second circuit layer is electrically connected to a semiconductor chip.

* * * * *